United States Patent
Imaizumi

(10) Patent No.: US 8,410,964 B2
(45) Date of Patent: Apr. 2, 2013

(54) AD CONVERSION METHOD AND AD CONVERSION CIRCUIT

(75) Inventor: Takashi Imaizumi, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/327,901

(22) Filed: Dec. 16, 2011

(65) Prior Publication Data

US 2012/0161995 A1 Jun. 28, 2012

(30) Foreign Application Priority Data

Dec. 22, 2010 (JP) ................................. 2010-286754

(51) Int. Cl.
*H03M 3/02* (2006.01)
(52) U.S. Cl. ......... 341/143; 341/141; 341/155; 341/164
(58) Field of Classification Search .................. 341/164, 341/141, 143, 155
See application file for complete search history.

(56) References Cited

U.S. PATENT DOCUMENTS 5,691,719 A * 11/1997 Wakimoto ..................... 341/141
7,126,522 B2 * 10/2006 Ogawa ........................... 341/155
7,209,066 B1 * 4/2007 Trumbo ......................... 341/155
7,852,246 B2 * 12/2010 Yang et al. ..................... 341/141

FOREIGN PATENT DOCUMENTS

JP 11-031968 2/1999

* cited by examiner

*Primary Examiner* — Khai M Nguyen
(74) *Attorney, Agent, or Firm* — IPUSA, PLLC

(57) ABSTRACT

A disclosed AD conversion circuit includes a holding portion storing sequence information, signal selection information and time information; a sequencing counter to be initialized by receiving a timing signal output at a predetermined period and counting upon receipt of a matching signal to obtain a sequencing counter count value; a time period counter to be initialized by receiving the timing signal or the matching signal and counting a time period counter count value; a comparator generating the matching signal when the time information matches the time period counter count value after comparison by referring to the sequence information using the sequencing counter count value; a selecting portion selecting analog signals of one type corresponding to the signal selection information obtained by referring to the sequence information using the sequencing counter count value out of analog signals of various types; and an AD converter converting the selected analog signals.

8 Claims, 5 Drawing Sheets

FIG.2

SELECTION TABLE

| SEQUENCE NUMBER | SELECTED SIGNAL NUMBER | SELECTED TIME |
|---|---|---|
| 0 | 2 | 5 |
| 1 | 3 | 3 |
| 2 | 1 | 4 |
| 3 | 3 | 4 |

US 8,410,964 B2

AD CONVERSION METHOD AND AD CONVERSION CIRCUIT

CROSS-REFERENCE TO RELATED APPLICATIONS

This patent application is based upon and claims the benefit of priority of Japanese Patent Application No. 2010-286754 filed on Dec. 22, 2010 the entire contents of which are incorporated herein by reference.

BACKGROUND OF THE INVENTION

1. Field of the Invention

The present invention generally relates to an AD conversion method and an AD conversion circuit. More specifically, the present invention relates to an AD conversion method and an AD conversion circuit for converting plural analog signals to digital signals.

2. Description of the Related Art

One type of a battery pack uses a lithium ion battery and is installed in a portable device such as a digital camera. In the lithium ion battery, it is generally difficult to detect battery residual power using the voltage of the lithium ion battery. Therefore, the battery residual power may be measured by detecting charging and discharging currents of a battery using a microcomputer and integrating the detected charging and discharging currents.

In a battery monitoring IC for measuring battery residual power, analog signals such as a voltage, a current and a temperature are converted to digital signals and supplied to a CPU. The CPU may undertake a temperature correction for the current value measured by the CPU or the like and integrate the charging and discharging currents.

FIG. 5 schematically illustrates an exemplary AD conversion circuit. Referring to FIG. 5, an analog signal indicative of a detected temperature is supplied, an analog signal indicative of a detected voltage is supplied, and an analog signal indicative of a detected current is supplied. These analog signals are supplied to a selector 4.

A signal selecting register 5 stores a selected signal number written by software operated by a CPU. The selected signal number is supplied from the signal selecting register 5 to the selector 4. The selector 4 selects the analog signal received from the terminal corresponding to the selected signal number and supplies the selected analog signal to the AD converter.

An enable signal is written in the conversion starting register 7 from software operated by the CPU. After the enable signal is written in the conversion starting register 7, the AD converter 6 converts the analog signal supplied from the selector 4 to a digital signal and outputs the converted digital signal from the terminal 8.

Patent Document 1 discloses an AD converter including a control unit for outputting a pause signal (STBY) for providing a conversion period and a pause period based on a trigger (TG), a timing control circuit for outputting the timing signal during the conversion period, and an AD converting unit for performing AD conversion by comparing an analog signal Va with a predetermined reference voltage by a comparator.

However, in this AD converter, the signals are selected and the AD conversion is started after software running in a CPU instructs to do so. Therefore, in order to perform the AD conversion, the CPU is operated to thereby increase power consumption. Further, there is a problem that the amount of programs of the software increases. [Patent Document 1] Japanese Laid-open Patent Publication No. 11-31968

SUMMARY OF THE INVENTION

Accordingly, embodiments of the present invention may provide a novel and useful AD conversion method and an AD conversion circuit solving one or more of the problems discussed above so as to perform the AD conversion of plural types of analog signals in a desired order and set up in conformity with a use for obtaining the most effective result in performing the AD conversion of the plural types of analog signals within a predetermined time.

More specifically, the embodiments of the present invention may provide an AD conversion circuit that receives analog signals of various types and selects the analog signals of any one type, and converts the selected analog signals of the one type to digital signals including a holding portion configured to store sequence information, signal selection information and time information so as to be associated with one another; a sequencing counter configured to be initialized by receiving a timing signal output at a predetermined period and to start counting upon receipt of a matching signal to obtain a sequencing counter count value; a time period counter configured to be initialized by receiving the timing signal or the matching signal and to count a time with a supplied clock as a time period counter count value; a comparator configured to generate the matching signal when the time information in the holding portion matches the time period counter count value after comparing the time information in the holding portion with the time period counter count value by referring to the sequence information in the holding portion using the sequencing counter count value; a selecting portion configured to select the analog signals of the one type corresponding to the signal selection information obtained by referring to the sequence information in the holding portion using the sequencing counter count value out of the analog signals of various types; and an AD converter configured to convert the analog signal of the one type selected by the selecting portion from analog to digital.

Another aspect of the present invention may be to provide the AD conversion circuit, wherein the holding portion is a rewritable non-volatile memory storing the signal selection information and the time information, and the time information is a selected time corresponding to the signal selection information.

Another aspect of the present invention may be to provide the AD conversion circuit, wherein the various types for the analog signals correspond to the signal selection information and includes at least any one of a current type, a voltage type and a temperature type.

Another aspect of the present invention may be to provide the AD conversion circuit, wherein the AD converter is a delta-sigma type.

Another aspect of the present invention may be to provide an AD conversion method that receives analog signals of various types and selects the analog signals of any one type, and converts the selected analog signals of the one type to digital signals including storing sequence information, signal selection information and time information in a holding portion so that the sequence information, the signal selection information and the time information are associated one another; initializing a sequencing counter by receiving a timing signal output at a predetermined period and starting counting with the sequencing counter upon receipt of a matching signal; initializing a time period counter by receiving the timing signal or the matching signal and counting a time with a supplied clock as a time period counter count value; generating the matching signal when the time information in the holding portion matches the time period counter count value after comparing the time information in the holding portion with the time period counter count value by referring to the sequence information in the holding portion using the sequencing counter count value; selecting the analog signals of the one type corresponding to the signal selection information obtained by referring to the sequence information in the holding portion using the sequencing counter count value out of the analog signals of various types; and converting the analog signals of the one type selected by the selecting portion from analog to digital.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 2 illustrates a selection table of the embodiment;

DETAILED DESCRIPTION OF THE PREFERRED EMBODIMENTS

A description is given below, with reference to the FIG. 1 through FIG. 4 of embodiments of the present invention.

Reference symbols typically designate as follows:
14: selector;
20: sequencer;
21: selection table;
22: sequencing counter;
23: time period counter;
24: comparator;
30: AD converter;
31: delta-sigma modulating portion; and
32: filter processing portion.
<Embodiment of an AD Conversion Mode>

Figure 1:
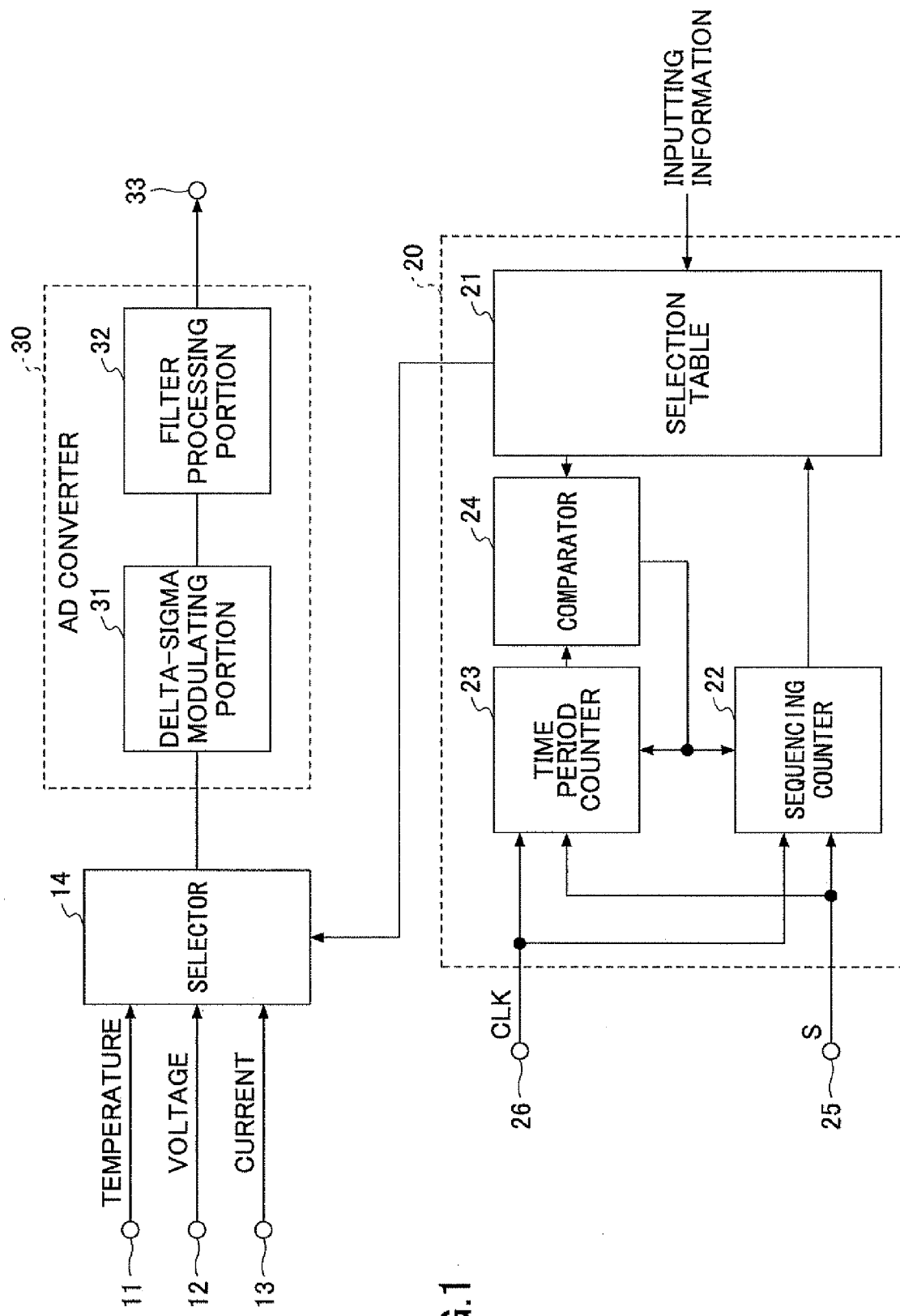
FIG. 1 schematically illustrates an AD conversion circuit of an embodiment of the present invention.

FIG. 1 is a block chart of an AD conversion circuit of an embodiment of the present invention. Referring to FIG. 1, an analog signal indicative of a detected temperature is supplied from a terminal 11, an analog signal indicative of a detected voltage is supplied from a terminal 12, and an analog signal indicative of a detected current is supplied from a terminal 13. These analog signals are in a form of voltage and are supplied to a selector 14 as a selecting unit. The types of the analog signals supplied to the selector 14 are not limited to three and may be two types or four types or more.

A sequencer 20 includes a selection table 21, a sequencing counter 22, a time period counter 23 and a comparator 24.

The selection table 21 is realized by, for example, a register, a rewritable non-volatile memory such as a flash ROM and a readout circuit. Referring to FIG. 2, a selected signal number (i.e., selected signal information) and a selected time (time information) are previously set and held in correspondence with a sequence number of 0 to N (sequence information). Referring to FIG. 2, N is three (N=3). However, N may be three or smaller or four or greater.

The selected signal number is used to select any one of the terminals 11 to 13 with the selector 14. The selected time is a time period during which the signal is selected. The selected time is in a range of several msec to several tens of msec and expressed in a unit of clock signal CLK.

The selected signal number and the selected time can be directly overwritten from the outside or indirectly overwritten via a CPU or the like. The overwritten value is stored in the non-volatile memory which can be overwritten.

The sequencing counter 22 is reset to zero after a timing signal S having a predetermined period of 1 sec or the like is supplied from a terminal 25. Thereafter, the count value is counted up by one count at every supplying of the timing signal S output at a predetermined period of 1 sec or the like from the terminal 25. Thereafter, the count value is counted up by one count for every supplying of a matching signal from the comparator 24. The count value of the sequencing counter 22 is supplied to the selection table 21 and the sequence number of the selection table is referred to. With this, the selection table 21 sends the selected signal number and the selected time corresponding to the referred sequence number from the rewritable non-volatile memory to the register, sends this selected signal number from the register to the selector 14, and sends this selected time from the register to the comparator 24.

The time period counter 23 is reset to zero when the timing signal S is supplied from the terminal or the matching signal is supplied from the comparator 24. Thereafter, when the matching signal is supplied from the comparator 24, the time period counter 23 is reset. Thereafter, the count value is counted up by one count for every supplying of the clock signal CLK from the terminal 26. The count value in the time period counter 23 is supplied to the comparator 24. The comparator 24 compares the count value from the time period counter 23 with the selected time from the selection table 21, generates the matching signal when the count value matches the selected time and supplies the generated matching signal to the sequencing counter 22 and the time period counter 23. The sequencing counter 22 counts up by one count when the matching signal is supplied, and the time period counter 23 resets the count value to zero when the matching signal is supplied.

The selected signal number read out of the selection table 21 is supplied to the selector 14. The selector 14 selects an analog signal from the terminal corresponding to the selected signal number and supplies the selected analog signal to an AD converter 30. Said differently, if the selected signal number is "1", the analog signal from the terminal 11 is selected. If the selected signal number is "2", the analog signal from the terminal 12 is selected, and if the selected signal number is "3", the analog signal from the terminal 13 is selected.

The AD converter 30 includes a delta-sigma modulating portion 31 and a filter processing portion 32. The delta-sigma modulating portion 31 performs pulse density modulation (PDM) for the analog signal supplied from the selector 14 and outputs a signal which undergoes one bit digital modulation. The output signal from the delta-sigma modulating portion 31 is converted to pulse code modulation data being a digital signal by the filter processing portion 32 and is output from the terminal 33.

<Delta-Sigma Modulating Portion>

Figure 3:
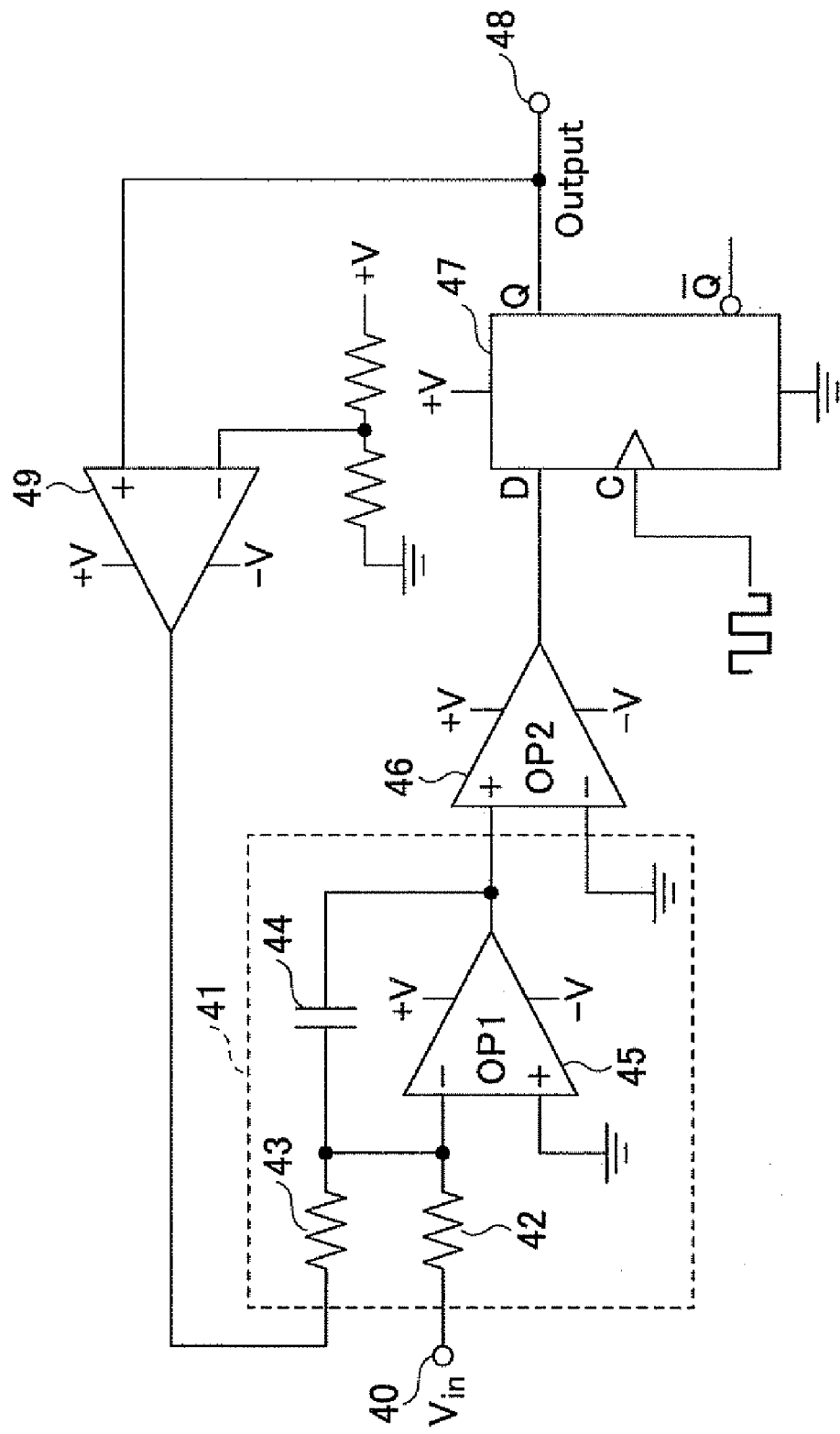
FIG. 3 illustrates a circuit structure of a delta-sigma modulating portion of the embodiment.

FIG. 3 illustrates a circuit structure of the delta-sigma modulating portion 31 of the embodiment. Referring to FIG. 3, an analog voltage Vin is supplied to a terminal 40 so as to be input into an integration circuit 41. The integration circuit 41 includes an input resistor 42, a feedback resistor 44, an integration capacitor and an operational amplifier 45. The integration circuit integrates a difference obtained by subtracting the analog voltage Vin from the output voltage of the an operational amplifier 49.

The output signal from the integration circuit 41 is quantized by a comparator including an operational amplifier 46, is delayed by one clock by a D-type flip flop 47 and is output from a terminal 48. The output from the terminal 48 is fed back to the integration circuit 41 via the operational amplifier 49 forming the one-bit DA converter.

<Operation of the AD Conversion Circuit>

Referring to the selection table 21 illustrated in FIG. 2, in the sequence number "0", the selected signal number is "2" and the selected time is "5"; in the sequence number "1", the selected signal number is "3" and the selected time is "3"; in the sequence number "2", the selected signal number is "1" and the selected time is "4"; and in the sequence number "3", the selected signal number is "3" and the selected time is "4".

Figure 4:
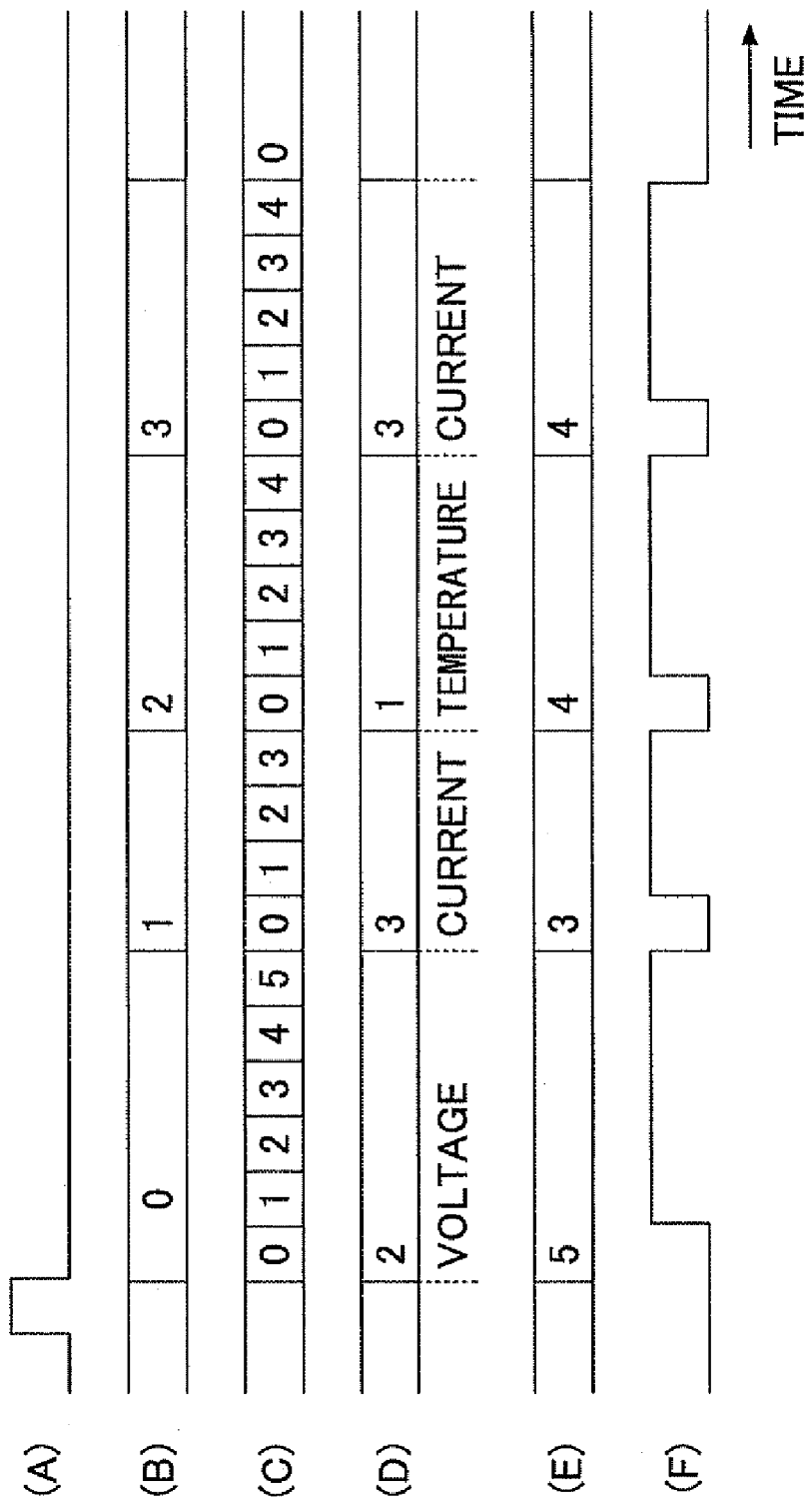
FIG. 4 illustrates a signal timing chart of the AD conversion circuit of the embodiment.
Figure 5:
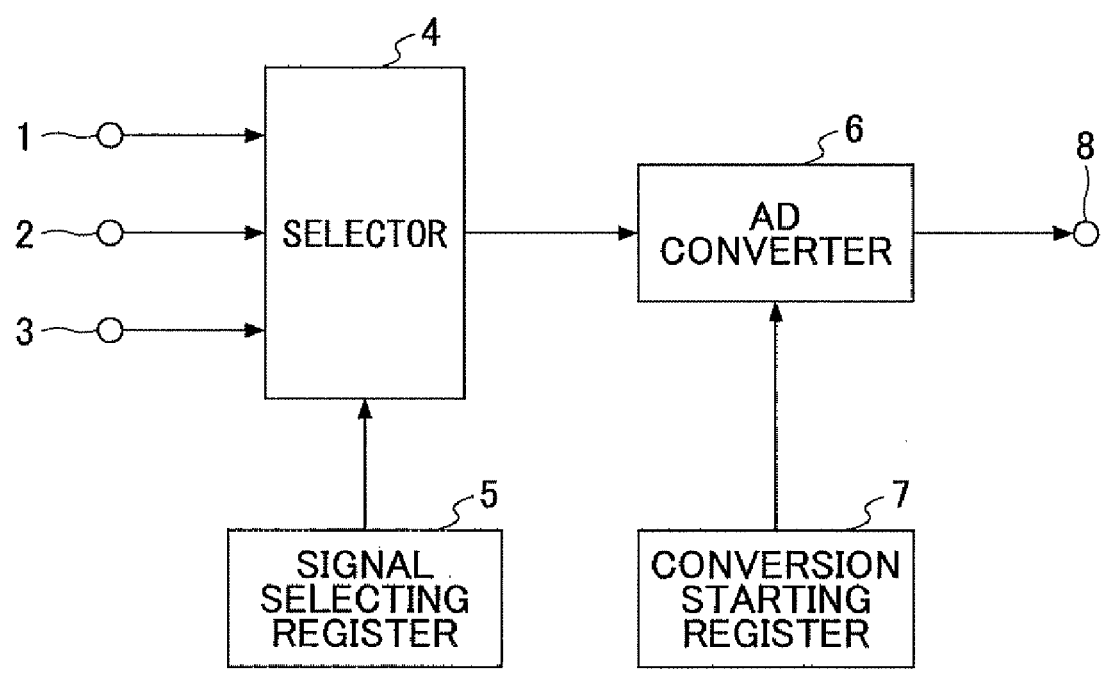
FIG. 5 schematically illustrates an exemplary AD conversion circuit.

By supplying a pulse of the timing signal S as illustrated in (A) of FIG. 4, a count value of the sequencing counter 22 is set to zero as illustrated in (B) of FIG. 4. At the same time, the count value of the time period counter 23 is set to zero as illustrated in (C) of FIG. 4. With this, the count value of the sequencing counter 22 becomes "0" and the selected signal number "2" illustrated in (D) of FIG. 4 and the selected time "5" illustrated in (E) of FIG. 4 corresponding to the sequence number "0" is read out of the selection table 21.

The selector 14 to which the selected signal number "2" is supplied selects the analog signal indicative of the voltage supplied from the terminal 12 and supplies the analog signal to the AD converter 30. The AD converter 30 outputs the digital signal of the voltage from the terminal 33 in a high level period illustrated in (F) of FIG. 4. A delay of about one clock signal from a change of the selected signal number illustrated in (D) of FIG. to a change of the digital signal illustrated in (F) of FIG. 4 is necessary for a conversion operation in the AD converter 30.

The count value of the time period counter changes as illustrated in (C) of FIG. 4. When the count value of the time period counter 23 illustrated in (C) of FIG. 4 matches the selected time "5" of the selection table 21, the comparator outputs the matching signal to render the count value of the sequencing counter 22 illustrated in (B) of FIG. 4 to be "1", and simultaneously the count value of the time period counter 23 is reset to be zero.

When the count value of the sequencing counter 22 becomes "1", the selected signal number "3" and the selected time "3" corresponding to the sequence number "1" are read from the selection table 21. The selector 14 to which the selected signal number "3" is supplied selects the analog signal indicative of the current supplied from the terminal 13 and supplies the analog signal to the AD converter 30. The AD converter 30 outputs the digital signal of the current from the terminal 33 in a high level period illustrated in (F) of FIG. 4.

Further, the count value of the time period counter 23 changes as illustrated in (C) of FIG. 4 by the supplying of the clock signal CLK. When the count value of the time period counter 23 matches the selected time "3" of the selection table 21, the comparator 24 outputs the matching signal. Then, the count value "2" of the sequencing counter illustrated in (B) of FIG. 4 becomes "2". Simultaneously, the count value of the time period counter 23 illustrated in (C) of FIG. 4 is reset to zero.

When the count value of the sequencing counter 22 becomes "2", the selected signal number "1" and the selected time "4" corresponding to the sequence number "2" are read from the selection table 21. The selector 14 to which the selected signal number "1" is supplied selects the analog signal indicative of the temperature supplied from the terminal 11 and supplies the analog signal to the AD converter 30. The AD converter 30 outputs the digital signal of the voltage from the terminal 33 in a high level period illustrated in (F) of FIG. 4.

Further, the count value of the time period counter 23 changes as illustrated in (C) of FIG. 4 by the supplying of the clock signal CLK. When the count value of the time period counter 23 matches the selected time "4" of the selection table 21, the comparator 24 outputs the matching signal. Then, the count value "2" of the sequencing counter illustrated in (B) of FIG. 4 becomes "3". Simultaneously, the count value of the time period counter 23 illustrated in (C) of FIG. 4 is reset to zero.

When the count value of the sequencing counter 22 becomes "3", the selected signal number "3" and the selected time "4" corresponding to the sequence number "3" are read from the selection table 21. The selector 14 to which the selected signal number "3" is supplied selects the analog signal indicative of the current supplied from the terminal 13 and supplies the analog signal to the AD converter 30. The AD converter 30 outputs the digital signal of the current from the terminal 33 in a high level period illustrated in (F) of FIG. 4. The digital signal of the current is continuously output until the count value of the time period counter 23 matches the selected time "4" of the selection table 21.

With the embodiment, when the selection table including the sequence number, the selected signal numbers and the selected times which mutually correspond are prepared, so that instructions for the AD conversion from the software run by the CPU becomes unnecessary. Then, the plural types of the analog signals may undergo the AD conversion in synchronism with the timing signal S output at the predetermined period and the clock signal CLK and in the predetermined order. Therefore, the. CPU is not uselessly operated and the power consumption for operating the CPU can be reduced.

In the predetermined period of the timing signal S, the plural types of the analog signals may undergo the AD conversion in the predetermined order. Further, it is possible to freely set the period during which the analog signals undergo the AD conversion. Consequently, even if the plural types of the analog signals undergo the AD conversion within the predetermined period using limited resources, it is possible to set in conformity with usage so that the most effective result is obtained. Thus, the optimum conversion is realized.

Although, in the embodiment, the selected signal numbers and the selected times are determined for each one of the sequence numbers, a selection start time based on a timing signal S may be set as the time information instead of the selected time. In this case, the time period counter 23 is reset by only the timing signal S from the terminal 25 and may not be reset by the matching signal. Said differently, the matching signal output by the comparator 24 is not supplied to the time period counter 23.

Although the AD converter 30 including the delta-sigma modulating portion is used in the embodiment, other AD converters such as a flash AD converter and a successive approximation AD converter may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An AD conversion circuit that receives analog signals of various types and selects the analog signals of one type, and converts the selected analog signals of the one type to digital signals, the AD conversion circuit comprising:
    a holding portion configured to store sequence information, signal selection information and time information so as to be associated with one another;
    a sequencing counter configured to be initialized by receiving a timing signal output at a predetermined period and to start counting upon receipt of a matching signal to obtain a sequencing counter count value;
    a time period counter configured to be initialized by receiving the timing signal or the matching signal and to count a time with a supplied clock as a time period counter count value;
    a comparator configured to generate the matching signal when the time information in the holding portion matches the time period counter count value after comparing the time information in the holding portion with the time period counter count value by referring to the sequence information in the holding portion using the sequencing counter count value;
    a selecting portion configured to select the analog signals of the one type corresponding to the signal selection information obtained by referring to the sequence information in the holding portion using the sequencing counter count value out of the analog signals of various types; and
    an AD converter configured to convert the analog signal of the one type selected by the selecting portion from analog to digital.

2. The AD conversion circuit according to claim 1,
    wherein the holding portion is a rewritable non-volatile memory storing the signal selection information and the time information, and
    the time information is a selected time corresponding to the signal selection information.

3. The AD conversion circuit according to claim 2,
    wherein the various types of the analog signals correspond to the signal selection information and include at least one of a current type, a voltage type and a temperature type.

4. The AD conversion circuit according to claim 3,
    wherein the AD converter is a delta-sigma type.

5. An AD conversion method that receives analog signals of various types and selects the analog signals of one type, and converts the selected analog signals of the one type to digital signals, the AD conversion method comprising:
    storing sequence information, signal selection information and time information in a holding portion so that the sequence information, the signal selection information and the time information are associated with one another;
    initializing a sequencing counter by receiving a timing signal output at a predetermined period and starting counting with the sequencing counter upon receipt of a matching signal;
    initializing a time period counter by receiving the timing signal or the matching signal and counting a time with a supplied clock as a time period counter count value;
    generating the matching signal when the time information in the holding portion matches the time period counter count value after comparing the time information in the holding portion with the time period counter count value by referring to the sequence information in the holding portion using the sequencing counter count value;
    selecting the analog signals of the one type corresponding to the signal selection information obtained by referring to the sequence information in the holding portion using the sequencing counter count value out of the analog signals of various types; and
    converting the analog signals of the one type selected by the selecting portion from analog to digital.

6. The AD conversion method according to claim 5,
    wherein the holding portion is a rewritable non-volatile memory storing the signal selection information and the time information, and
    the time information is a selected time corresponding to the signal selection information.

7. The AD conversion method according to claim 6,
    wherein the various types of the analog signals correspond to the signal selection information and include at least one of a current type, a voltage type and a temperature type.

8. The AD conversion method according to claim 7,
    wherein the converting includes using an AD converter of a delta-sigma type.

* * * * *